(12) United States Patent
Rhode (10) Patent No.: US 11,720,542 B2
(45) Date of Patent: Aug. 8, 2023

(54) METHOD FOR ASSESSING VALIDATION POINTS FOR A SIMULATION MODEL

(71) Applicant: Robert Bosch GmbH, Stuttgart (DE)

(72) Inventor: Stephan Rhode, Karlsruhe (DE)

(73) Assignee: ROBERT BOSCH GMBH, Stuttgart (DE)

( * ) Notice: Subject to any disclaimer, the term of this patent is extended or adjusted under 35 U.S.C. 154(b) by 221 days.

(21) Appl. No.: 17/358,337

(22) Filed: Jun. 25, 2021

(65) Prior Publication Data

US 2022/0058176 A1    Feb. 24, 2022

(30) Foreign Application Priority Data

Aug. 20, 2020   (DE) .......................... 102020210563.4

(51) Int. Cl.
*G06F 16/00* (2019.01)
*G06F 16/23* (2019.01)
(Continued)

(52) U.S. Cl.
CPC .......... *G06F 16/2365* (2019.01); *G06F 17/18* (2013.01); *G06F 30/20* (2020.01)

(58) Field of Classification Search
CPC ...... G06F 16/2365; G06F 17/18; G06F 30/20; G06F 16/906; G06F 30/15; G06F 2111/06
See application file for complete search history.

(56) References Cited

U.S. PATENT DOCUMENTS 8,478,506 B2 *  7/2013  Grichnik ............... B60W 40/00
                                                    701/105
8,768,675 B2 *  7/2014  Bracker ................ G05B 17/02
                                                    703/13

(Continued)

OTHER PUBLICATIONS

Von Der Lippe, "Wie Groß Muss Meine Stichprobe Sein, Damit Sie Reprasentativ Ist? Wie Viele Einheiten Müssen Befragt Werden? Was Heißt "Repräsentativität"? [How Big Does my Sample Have to be to be Representative? How Many Units Have to be Interviewed? What Does "Representativeness" Mean?]," School of Social and Economic Sciences, No. 187, 2011, pp. 1-79. <http://www.von-der-lippe.org/dokumente/Wieviele.pdf> Downloaded Jun. 23, 2021.

(Continued)

*Primary Examiner* — Noosha Arjomandi
(74) *Attorney, Agent, or Firm* — Norton Rose Fulbright US LLP; Gerard Messina (57) ABSTRACT

A method for assessing validation points for a simulation model. The method includes: obtaining a reference measured value for at least two measuring points; determining a model form error for each of the at least two measuring points, based on a deviation between the reference measured value of the particular measuring point and a probability distribution for a simulation value at the measuring point, the probability distribution being obtained from the simulation model; forming a metamodel of the model form errors, based on the determined model form errors for the measuring points; determining an uncertainty of the metamodel for at least one further data point that is not contained in the measuring points; and defining the at least one data point as sufficient for a virtual validation if the uncertainty of the metamodel at the at least one further data point is less than a predefined limiting value.

12 Claims, 6 Drawing Sheets

(51) Int. Cl.
*G06F 17/18* (2006.01)
*G06F 30/20* (2020.01)

(56) References Cited

U.S. PATENT DOCUMENTS

| | | | | |
|---|---|---|---|---|
| 11,120,174 | B1* | 9/2021 | Ciarlini | G06F 30/20 |
| 11,327,878 | B2* | 5/2022 | Raghupatruni | G06F 11/3692 |
| 2005/0071805 | A1* | 3/2005 | Lauterbach | G06F 8/20 |
| | | | | 717/107 |
| 2013/0103373 | A1* | 4/2013 | Benayon | G06Q 10/067 |
| | | | | 703/6 |
| 2016/0357179 | A1* | 12/2016 | Heck | G06F 30/20 |
| 2017/0300599 | A1* | 10/2017 | Becerik-Gerber | G06F 30/13 |
| 2017/0361856 | A1* | 12/2017 | Fischer | B60L 3/12 |
| 2020/0409823 | A1* | 12/2020 | Sohns | G06F 16/2453 |
| 2021/0124854 | A1* | 4/2021 | Wang | G06F 30/18 |
| 2021/0311217 | A1* | 10/2021 | Khan | E21B 49/00 |
| 2021/0334435 | A1* | 10/2021 | Endler | G06F 30/20 |
| 2021/0342238 | A1* | 11/2021 | Gladisch | G06F 11/263 |
| 2021/0342239 | A1* | 11/2021 | Gladisch | G06F 11/2257 |
| 2021/0364393 | A1* | 11/2021 | Gladisch | G01M 17/007 |
| 2022/0067737 | A1* | 3/2022 | Wittenbach | G06N 3/047 |
| 2022/0171901 | A1* | 6/2022 | Von Keler | G06F 30/20 |
| 2022/0390356 | A1* | 12/2022 | Gasiorowski | G03F 7/70625 |

OTHER PUBLICATIONS

Roy et al., "A Comprehensive Framework for Verification, Validation, and Uncertainty Quantification in Scientific Computing," Computer Methods in Applied Mechanicsand Engineering, vol. 200, Issues 25-28, 2011, pp. 2131-2144. <http://ftp.demec.ufpr.br/disciplinas/TM798/Artigos_seminarios/roy_oberkampf_2011-verification.pdf> Downloaded Jun. 23, 2021.

* cited by examiner

METHOD FOR ASSESSING VALIDATION POINTS FOR A SIMULATION MODEL

CROSS REFERENCE

The present application claims the benefit under 35 U.S.C. § 119 of German Patent Application No. DE 102020210563.4 filed on Aug. 20, 2020, which is expressly incorporated herein by reference in its entirety.

FIELD

The present invention relates to a method for assessing validation points for a simulation model, and a processing unit and a computer program for carrying out same.

BACKGROUND INFORMATION

Models are validated to determine whether a simulation model can satisfactorily represent the modeled system. During the validation, reference values, for example actual measurements, are generally compared to results of the simulation model and deviations are checked. The result of a validation may therefore depend greatly on the reference measurements carried out, for example on the number and design of the measurements.

It is of particular interest whether the model accuracy is sufficient for the field of application in which the model is to be used. Ideally, a model is therefore completely validated using data (actual measurements, for example) that originate from the application space of the model. In practice, however, it is often not possible for the application space to be completely encompassed by the validation space.

In order to select suitable measurements for validation purposes, generally a maximum gain in knowledge is generally sought with minimum (cost) expenditure, for example a broad coverage of value ranges with sufficiently low measurement uncertainty, but at the same time with as few measurements as possible. Various methods exist for this planning of reference measurements. However, these methods alone generally do not allow decisions concerning situations in which the validation via experiments is not possible or desirable in all areas, and therefore simulations are to be used for the validation.

SUMMARY

According to the present invention, a method for assessing validation points for a simulation model and also a processing unit and a computer program for carrying out same, are provided. Advantageous embodiments of the present invention are disclosed herein.

In accordance with an example embodiment of the present invention, a method for assessing validation points for a simulation model is provided which is based on the following steps: reference measured values are obtained for at least two measuring points, for example via suitable reference measurements, the measuring points in each case being defined by one or multiple parameters (environmental parameters, boundary conditions, for example). For each of the at least two measuring points, a model form error is then determined in each case, in particular based on a deviation between the reference measured value of the particular measuring point and a probability distribution for a simulation value at the particular measuring point, the probability distribution for the simulation value being obtained from the simulation model. A metamodel of the model form errors is subsequently formed, based on the determined model form errors for the at least two measuring points, and an uncertainty of the metamodel is determined for at least one further data point that is not contained in the at least two measuring points. If this uncertainty of the metamodel at the at least one further data point is less than a predefined limiting value, the at least one further data point is defined as sufficient for a virtual validation.

The probability distribution for the simulation value as a general case may generally be a probability box or p-box, which is formed from epistemic and/or aleatoric uncertainties of the simulation model. It is understood that the probability distribution may thus also be present as an interval or as a simple distribution function if only a portion of the stated uncertainties of the simulation model are incorporated.

Likewise, each reference measured value may be indicated as a cumulative distribution function, based on the measurement uncertainty at the particular measuring point.

According to one specific example embodiment of the present invention, the model form error may be determined as an area validation metric that indicates the deviation between the reference measured value and the probability distribution for the simulation value. In particular, the area validation metric may describe an area between the probability box of the simulation value and the distribution function of the reference measured value.

In further specific example embodiments of the present invention, if the uncertainty of the metamodel at at least one data point is greater than a predefined limiting value, at least one further reference measured value at at least one further measuring point may be obtained or requested, and the model form error may be redetermined for the further measuring point or the further measuring points. This at least one further model form error for the further measuring point may then be used to improve the metamodel.

The at least one further measuring point may correspond, for example, to the at least one data point at which the uncertainty is greater than the predefined limiting value. Alternatively, however, measuring points may also be selected at other locations, for example in the immediate vicinity of the checked data point or also at locations farther away; the uncertainty of the checked data point may thus also preferably be further reduced by improving the metamodel.

Suitable measuring points for obtaining reference values may optionally be selected from a plurality of data points. In particular, this selection may be made based, for example, on a cost function that takes into account at least the testing costs for obtaining a reference value at a measuring point, as well as the exploration and exploitation that are obtained via a reference value at the measuring point. The problem may preferably be regarded as a minimization of the testing costs with maximum exploration and exploitation.

In particular, in a further specific embodiment of the present invention, an expanded cost function may then be formed, which additionally includes the uncertainty of the metamodel for the plurality of data points as a criterion. For example, a minimization of this uncertainty of the metamodel, or alternatively, falling below the predefined error limiting value, may then be used as an additional objective.

The method may also include the requesting of one or multiple reference measured values at the selected measuring points, for example in the form of a control of a test stand or an output of suitable measuring points as data values for a user or some other system where the reference measurement is then to be carried out. After carrying out the (further)

reference measurements, an obtained measured value may then be returned to a computer program, for example, which carries out the formation and evaluation of the metamodel, for example by automatically reading in measured data in a measuring system that is provided with suitable interfaces, or by prompting a user for data input.

For the first reference measured values and/or for further reference measured values, it may optionally be checked in each case whether the exploration is adequate, i.e., whether the measurement uncertainty of the obtained reference measured values is below a predefined limiting value, and if this is not the case, further reference measured values may be obtained before the metamodel is formed.

A processing unit according to the present invention, for example a PC, is configured to carry out a method according to the present invention, in particular by programming.

In addition, implementing a method according to the present invention in the form of a computer program or computer program product containing program code for carrying out all method steps is advantageous, since this entails particularly low costs, in particular when an operating control unit is also utilized for further tasks, and therefore is present anyway. Suitable data media for providing the computer program are in particular magnetic, optical, and electrical memories such as hard disks, flash memories, EEPROMs, DVDs, and others. In addition, downloading a program via computer networks (Internet, Intranet, etc.) is possible.

Further advantages and embodiments of the present invention result from the description and the figures herein.

The present invention is schematically illustrated based on exemplary embodiments in the figures, and described below with reference to the figures.

DETAILED DESCRIPTION OF EXAMPLE EMBODIMENTS

The selection of reference measurements for a simulation model is explained below with reference to FIG. 1. The area from which validation data are utilized for validating a simulation model may be referred to as a validation domain 110, while the value range in which the results of the simulation model are used is referred to as an application domain 100. In practice, however, these two areas or domains are generally not congruent. For example, it may be cost-intensive or even impossible to obtain experimental data from the entire application area of interest for the validation.

Figure 1:
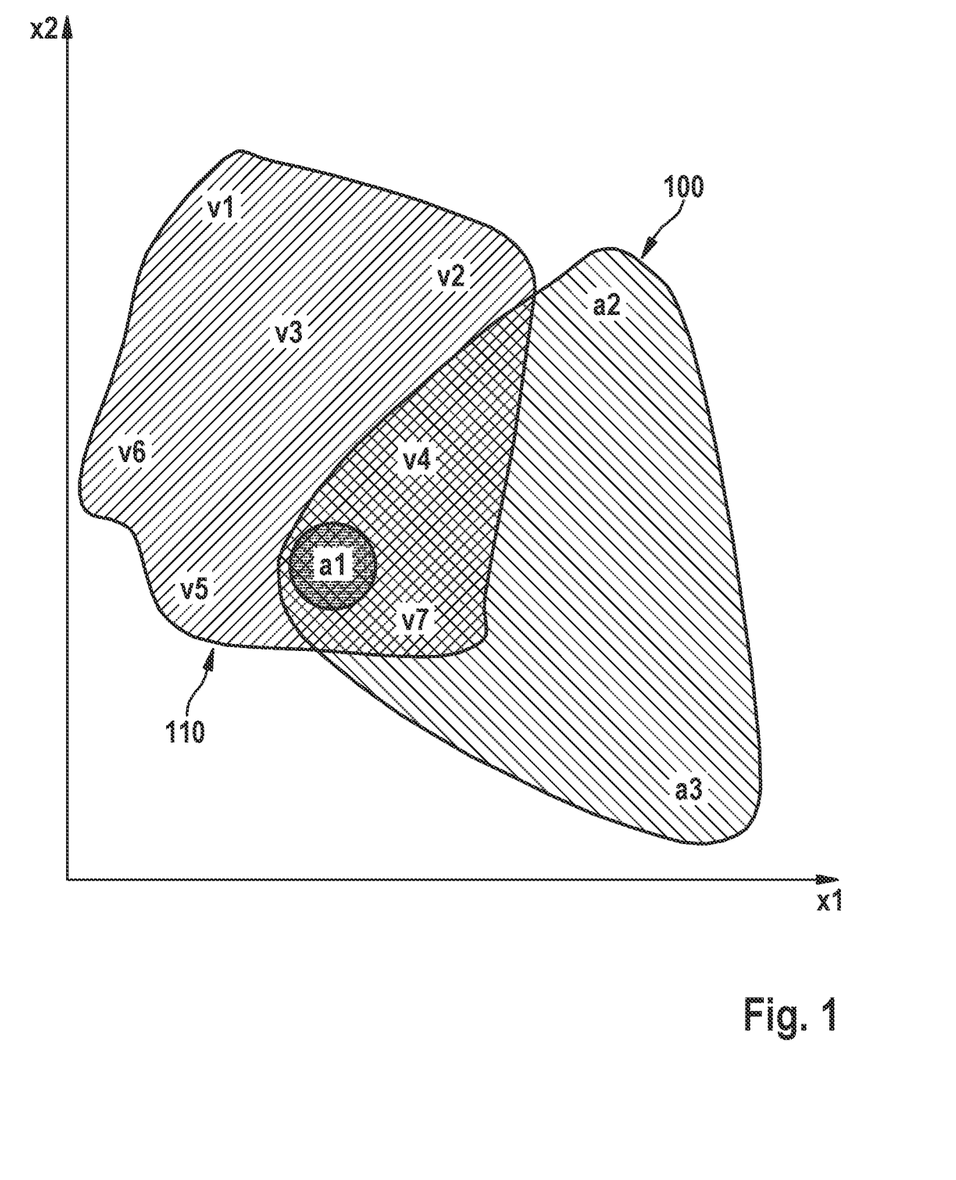
FIG. 1 shows a two-dimensional illustration of the application space and the validation space for a simulation model as a function of two parameters.

The application domain and validation domain may be illustrated as a two-dimensional space as in FIG. 1, for example, different parameters x1, x2 that characterize the system or its surroundings being plotted on two axes. The two depicted areas correspond to application domain 100 and validation domain 110; depicted points v1 through v7 are validation points, i.e., points at which data for the validation are obtained and utilized, while depicted points a1 through a3 are application points at which the model is to be used or applied. The data may be interpolated or extrapolated between the points. If the application points are situated inside the validation space, this is referred to as model interpolation; if the application points are situated outside the validation space, this is referred to as model extrapolation.

In general, reference measurements are subject to a tradeoff between exploration and exploitation, both objectives generally entailing costs such as test stand and personnel costs.

The term "exploration" is understood to mean that new knowledge is to be gained; for example, the knowledge about measurement uncertainties is to be expanded. For this purpose, for example multiple repeated measurements may be made at the same point in the validation space in order to determine the distribution of the measurement uncertainty. Based on FIG. 1, for example 100 measurements could be made at point v7. However, since each measurement consumes resources and entails costs, an attempt is made to keep the number of measurements to the minimum necessary. For simple random samples, the necessary scope of random sampling may be determined with the aid of a distribution assumption, for example. Further details in this regard are found, among other sources, in "Wie groß muss meine Stichprobe sein, damit sie repräsentativ ist?" [How large must my random sample be in order to be representative?], von der Lippe (2011), discussion contribution from the School of Social and Economic Sciences, University of Duisburg-Essen, Essen Campus, No. 187, downloadable at http://www.von-der-lippe.org/dokumente/Wieviele.pdf.

Usually, however, neither the distribution of the population universe nor its dispersion is known, so that "rules of thumb" with adequate safety margins are utilized, which often result in a large number of required random samples.

Exploitation describes the attempt to optimize the statements or decisions that are possible due to the existing knowledge. With regard to the validation of the simulation model, an attempt is therefore made to cover all possible areas of the space during exploitation of the validation space, so that the reference measurements have maximum meaningfulness for the entire space. As illustrated in FIG. 1, for example reference measurements v1 through v7 may thus be selected which are as far apart from one another as possible and distributed over the entire validation space.

The tradeoff between exploration and exploitation may be made using various methods, known, for example, as "active testing" or "Bayesian optimization," more generally as "hyperparameter optimization." The exploration may be solved separately, for example with the aid of stochastic convergence, so that repeated measurements are made until their distribution converges. Numerous additional methods for selecting suitable measuring points for reference measurements are known by the term "design of experiment" or statistical experimental design.

All these methods attempt to maximize the gain in knowledge through exploration and exploitation and thereby limit the testing costs. Thus, this involves a pareto-optimal problem.

In addition to experimentally obtained validation points for a simulation model, it is possible to replace at least a portion of the validation points with simulations. This principle is referred to as "virtualized release." Models are used in order to supply validation statements concerning application points situated outside the validation space. To define suitable experiments and to decide whether the particular application point can be validated by modeling or whether further reference measurements are necessary at this point, according to the present invention, in addition to exploration and exploitation, both of which are used for the gain in knowledge, an additional criterion may be introduced into the planning of the reference measurements.

One possible specific embodiment for such a criterion is described below, using the examples in FIGS. 2a through 2d. These figures in each case show probability boxes (p-boxes) for simulated values of a model to be validated, together with the cumulative distribution function (CDF) of the reference measurement, i.e., the statistical distribution of the measured values resulting from the measurement uncertainty of the reference measurement.

The probability boxes are determined based on uncertainties of the model to be validated, which result from the model inputs (model input uncertainty), for example due to the input values, boundary conditions, model assumptions, and others. The probability box maps a probability distribution for the target variable, which is defined by a left or lower limit and a right or upper limit, and which corresponds to a set of distribution functions between the limits. The width of the probability box specified by these two limits describes the systematic or epistemic uncertainties, i.e., uncertainties that arise due to knowledge that is not present or not utilized. In contrast, the slope of the limits of a probability box in each case indicates the statistical or aleatoric uncertainties, which are subject to essentially random processes. It is understood that, depending on the modeling, it is also possible to take into account only epistemic or only aleatoric uncertainties; in these cases, the general probability box corresponds to an interval or a distribution function. References to a probability box below are also intended to include these and other special cases.

For modeling using known input values and certain defined uncertainties, it is initially assumed that the uncertainties in the output values of the model, propagated by the model, may thus be determined in the form of the obtained probability boxes.

However, further additional uncertainties in the simulated output values arise due to model properties. These represent the model form error, which thus describes the additionally existing deviation of the modeled value, including uncertainties, from the actual reference value. There are various approaches for quantifying this model form error. One possible approach is the area validation metric (AVM), i.e., the area also shown in FIG. 2; however, it is understood that other methods for representing and quantifying the model form error may also be used. The derivation and application of the probability boxes as well as the formation of an area validation metric is described in greater detail, for example, in the document "A comprehensive framework for verification, validation, and uncertainty quantification in scientific computing," Roy/Oberkampf, Computer Methods in Applied Mechanics and Engineering 200(25), pp. 2131-2144.

FIGS. 2a through 2d show distribution functions (CDF) for four different reference measured values 210a, 210b, 210c, 210d, respectively, at different measuring points. Each reference measured value may be made up of a plurality of individual measurements encompassing the stated parameters, so that a statistical distribution of values results which forms the corresponding cumulative distribution function as indicated. For example, for obtaining the reference measured value in FIG. 2a, which has uncertainties, multiple measurements of the yaw rate at a speed of 80 km/h may be made. The number of measurements, as already described, may be established in such a way, for example, that sufficient information concerning the measurement uncertainty may be obtained with the fewest possible number of measurements. Correspondingly, the distribution function maps the reference measured value together with the measurement uncertainties.

Also shown are probability boxes 200a, 200b, 200c, 200d of values, modeled using a simulation model, at the measuring points which have been constructed based on the model input uncertainties. The width of the probability box is defined, respectively, by an upper limit 204a, 204b, 204c, 204d of the uncertainties and a lower limit 202a, 202b, 202c, 202d. The examples relate to the measurement or simulation of a yaw rate $\dot{\Psi}$ of a vehicle at different speeds, which is of interest, for example, for a vehicle dynamics test or for a general steering control. The yaw rate describes the angular velocity of a rotation about the yaw axis. Actual experiments entail significant effort and costs for such a test, so that it is advantageous to replace actual validation measurements, at least in part, with modeled values.

Figure 2A:
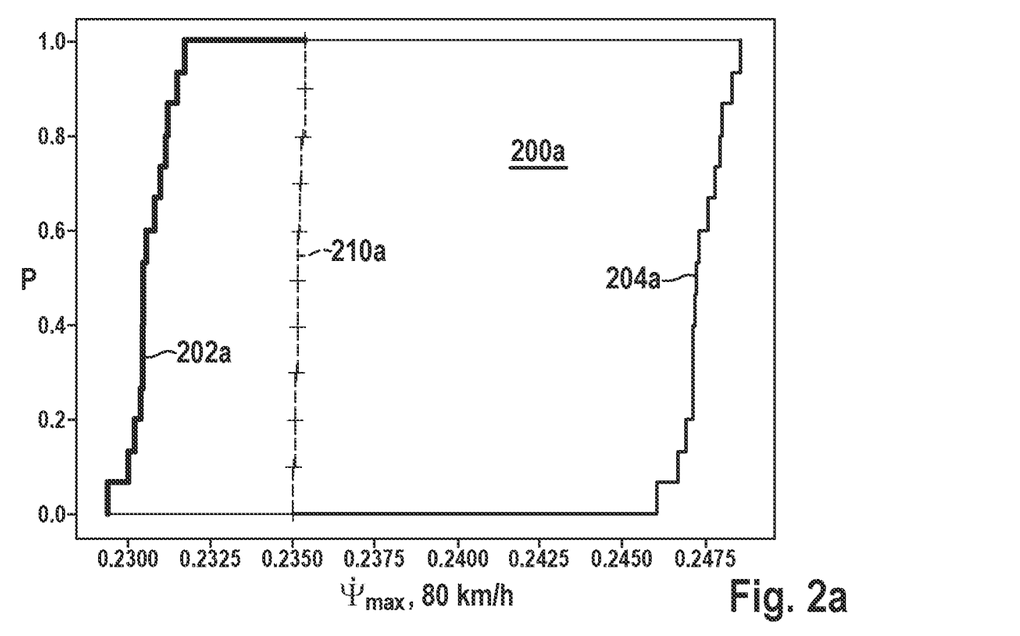
FIGS. 2a through 2d show model form errors of a simulation model at various validation points.
Figure 2B:
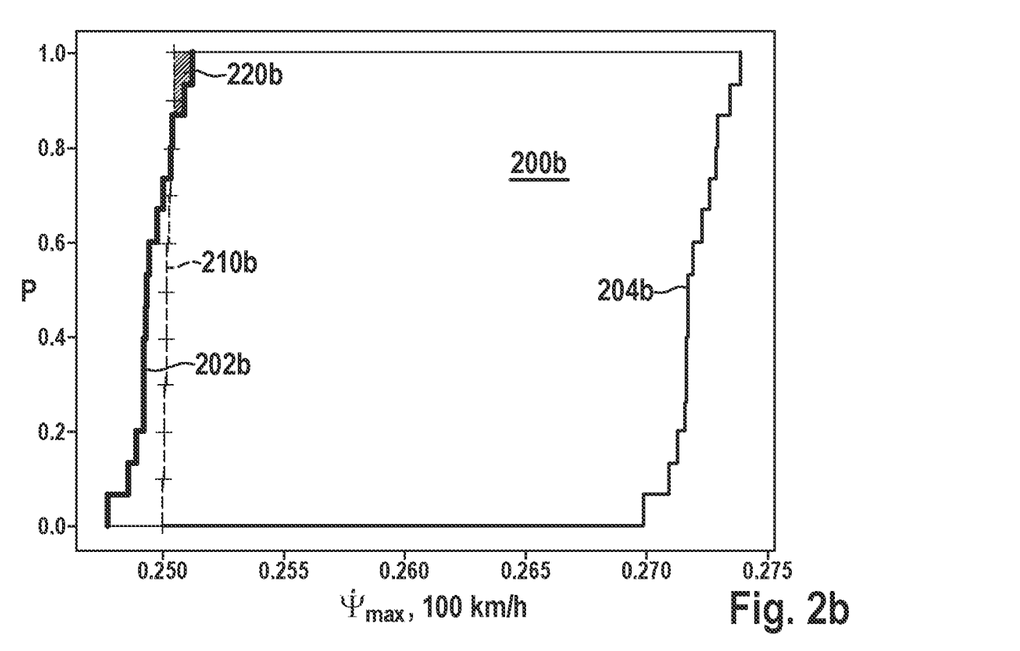
Figure 2C:
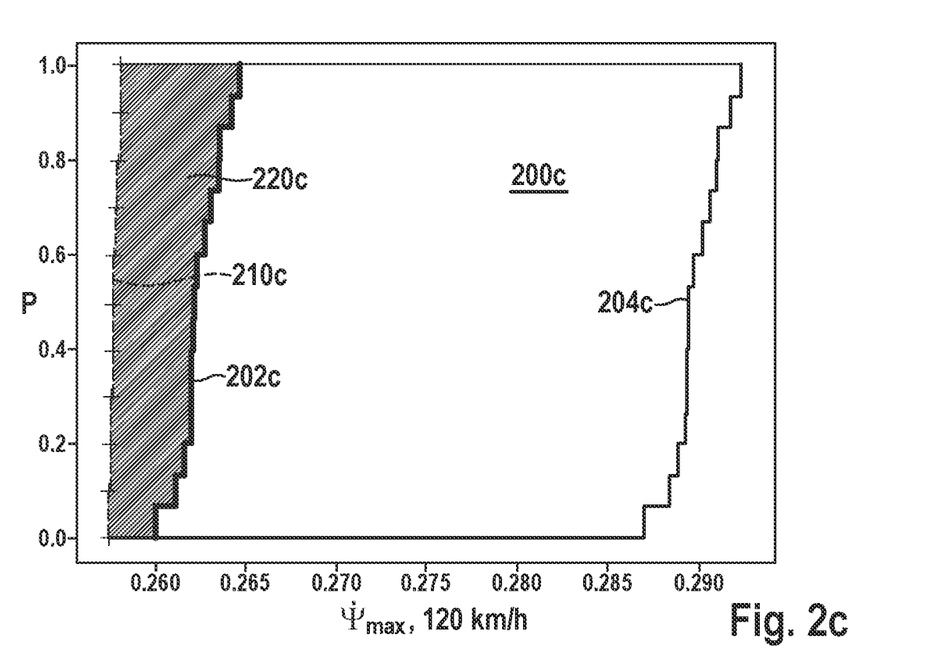
Figure 2D:
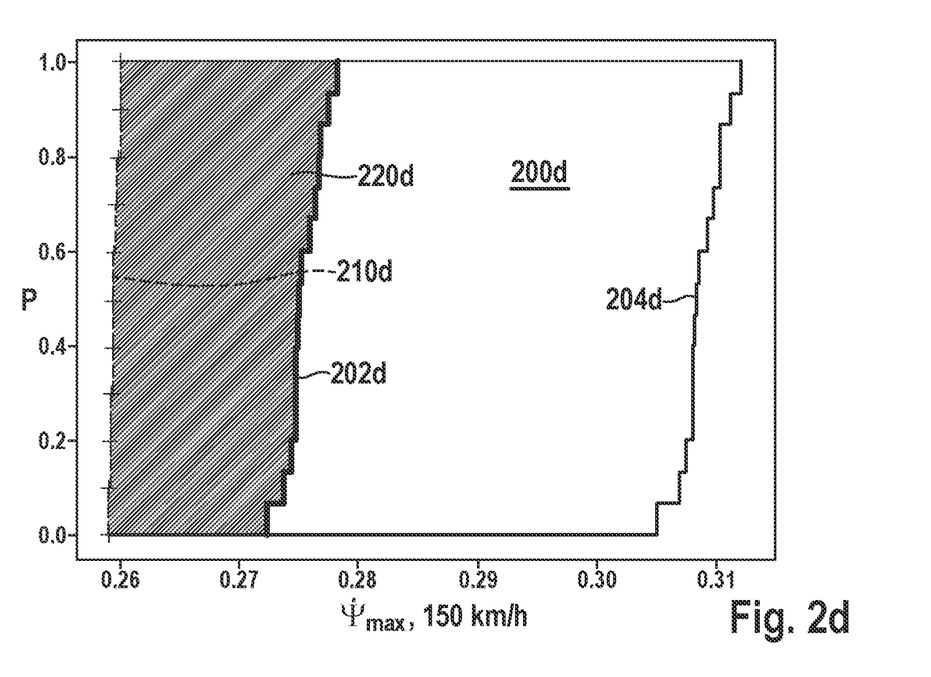

Each of the diagrams indicates, on the x axis, maximum yaw rate $\dot{\Psi}_{max}$ in relation to a fixed speed of the vehicle that is predefined as a boundary condition. The measuring point is defined by the speed as a parameter. The y axis indicates cumulative probability P between 0 and 1 for the values of the yaw rate. FIG. 2a relates to the maximum yaw rate of a vehicle at 80 km/h, FIG. 2b shows the maximum yaw rate of a vehicle at 100 km/h, FIG. 2c shows the maximum yaw rate at 120 km/h, and FIG. 2d shows the maximum yaw rate at 150 km/h. For this example it may be assumed that all four diagrams from FIG. 2 relate to the same simulation model to be validated; however, in principle the considerations that are shown apply to each model. The probability box may be different for each application point, even though these differences are not clearly visible or shown in the present diagrams.

In the example from FIG. 2a at 80 km/h, it is apparent that the reference measurement, together with all measurement uncertainties that are indicated by distribution function 210a of the reference measurement, is situated completely inside probability box 200a of the associated simulation value. Thus, an additional model form error is not present in this case.

In the example of FIG. 2b, for a vehicle speed of 100 km/h, distribution function 210b of the reference measurement intersects lower limit 202b of probability box 200b of the simulated value. A fairly large portion of distribution function 210b is situated inside probability box 200b, while a small portion is situated outside the value ranges expected in the simulation. Small crosshatched area 220b at the top left indicates the area that is situated between the reference measurements and the simulated values, i.e., the additional deviation of the reference measurement from the modeled result together with input uncertainties, and thus the model form error. Area 220b between the curves, i.e., the area between the boundaries of probability box 200b and distribution function 210b of the measurement, may be used as a measure for the model form error. This measure is also referred to as the area validation metric.

In FIG. 2c, the model form error in the form of area validation metric 220c may also be evaluated in the same way. In this case, reference measurement 210c at 120 km/h is situated completely outside probability box 200c for the simulation value; all reference measured values are below the simulated values, even taking the uncertainties into account. Crosshatched area 220c between the reference measurement or associated distribution 210c and simulation probability box 200c, which is much larger here than in FIG. 2b, may be reascertained. Lastly, FIG. 2d shows the values of a further measuring point or validation point at 150 km/h, in which reference measurement 210d and simulated values 200d are situated even farther apart than in FIG. 2c, i.e., an even greater model form error 220d results.

It is understood that the stated steps and principles may be easily transferred to target variables other than a yaw rate, which is mentioned here only as an example. Likewise, the reference measurements as well as the probability boxes of the simulations may have a design that is partially or completely different.

At all validation points in FIG. 2, the model form errors, implemented here as area validation metrics 220, have different magnitudes but are unambiguously ascertainable.

When, for a simulation model, one or multiple validation points are already present whose model form error is known or ascertainable, for example as above by determining the deviation from the reference measurement, the model form error is initially unknown for further points in the application space at which no validation has yet been made. However, a metamodel for the model form error may be formed via the known validation points. This may involve, for example, a simple extrapolation and/or interpolation of the model form error, for example using a polynomial function or a linear approximation, with the already known model form errors as supporting points. However, other approximation functions are of course also usable, and more complex metamodels based on the known model form errors are possible.

It is thus possible to also determine the uncertainty or a confidence interval for the values of the metamodel thus formed.

FIGS. 3a through 3d show various examples of extrapolated model form errors together with associated error ranges.

Each data point in one of the figures corresponds to a model form error for a certain validation point, which is defined by at least one parameter. For example, in this way model form errors 220, which have been obtained from FIGS. 2a through 2d for individual validation points as described above, could be incorporated into a single metamodel, thus allowing an extrapolation or interpolation of the model form error to other data points, for example the extrapolated model form error that is expected at a speed above 150 km/h, or an interpolated model form error that is expected at a speed between two of the known points (for example, between 0 km/h and 80 km/h).

Similarly, in FIG. 3 the speed in km/h is indicated in each case as a parameter on the x axis, while the model form error is indicated on the y axis. Individual points 310 indicate the model form error of the associated measuring point. For reasons of clarity, not all data points are individually provided with reference numerals in the figures; however, it is understood that all model form errors obtained from measuring points are being referred to in each case. Based on these data points, an approximation curve such as a regression curve is formed, which is indicated as a solid curve 320a, 320b, 320c, 320d; in addition, a corresponding lower limit 322 and upper limit 324 for the error or the confidence interval, illustrated as dashed-line curves, are formed in each case. It is understood that the various regression functions and validation points shown are only examples, and completely different approximations may also result, depending on the validation points and model formation that are present. Additional data points 330, 332, indicated by error bars, may then be ascertained in each case, based on regression curve 320 (i.e., the metamodel). It is thus possible to determine the model form error and the error of the metamodel, for example for the entire curve or for a certain data point of interest which comes into consideration for the virtual validation, for example.

Figure 3A:
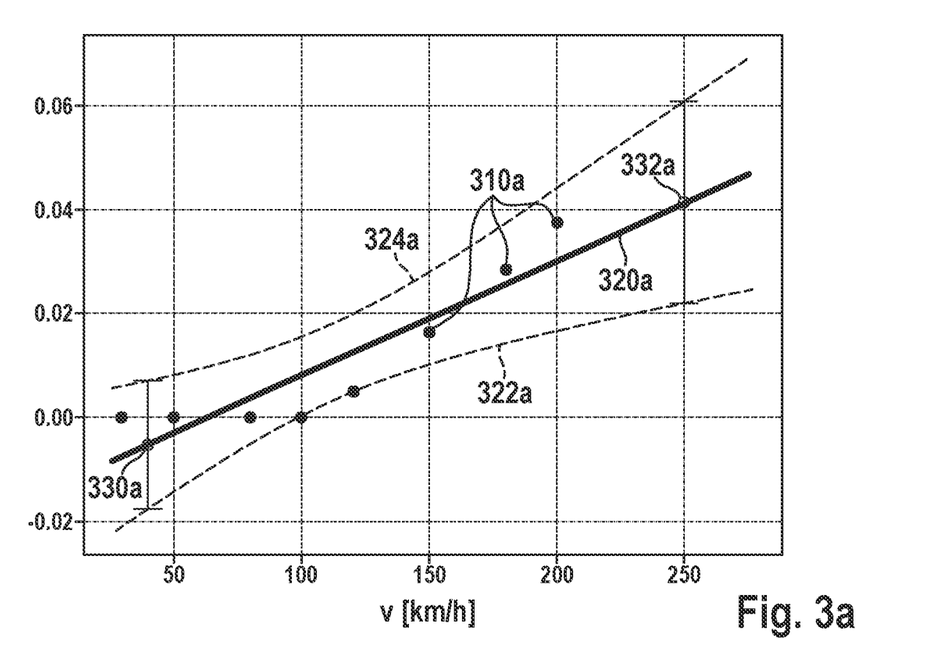
FIGS. 3a through 3d show various metamodels of a model form error together with confidence intervals.

The error of the metamodel may be subsequently evaluated at at least one point. This may be an interpolated or extrapolated value. For example, FIG. 3a illustrates multiple values 310a for the model form errors at measuring points as individual points without error bars. These are intended to represent model form errors that have been formed from actual measuring points and the associated simulation values. Solid-line regression curve 320a, i.e., the metamodel of the model form error, has then been formed from these values. The two values 330a, 332a, each shown with error bars, for the model form error may then be obtained from the metamodel at additional data points at which no measurements have yet been made; left value 330a shows an interpolated value, while right value 332a is an extrapolated value that is situated considerably above the measured points. As is apparent in the diagram, the uncertainty or the confidence interval of upper value 330a is much greater than that of lower value 332a.

Figure 3B:
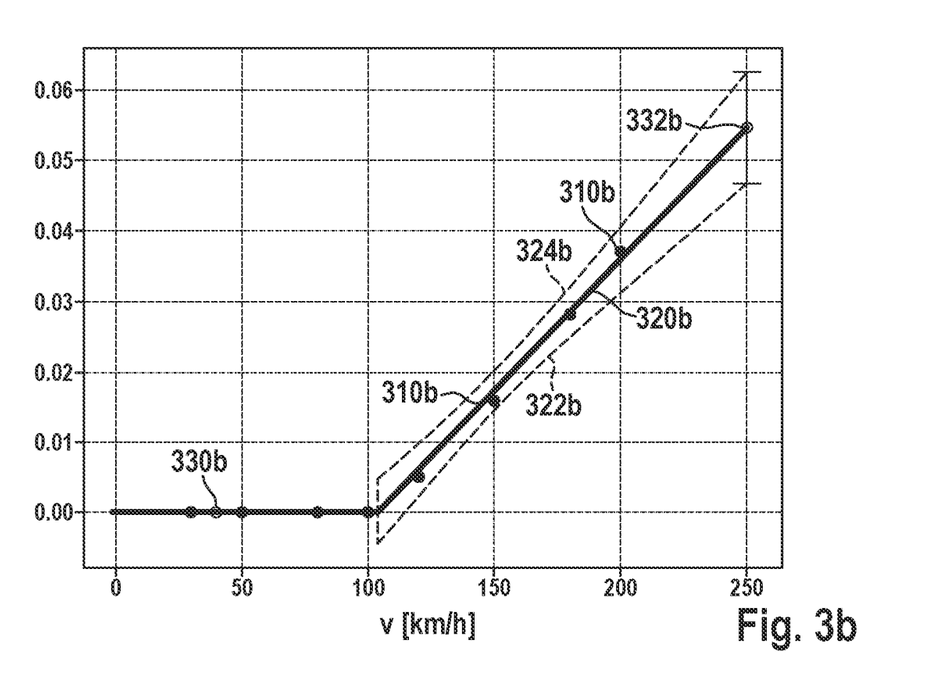
Figure 3C:
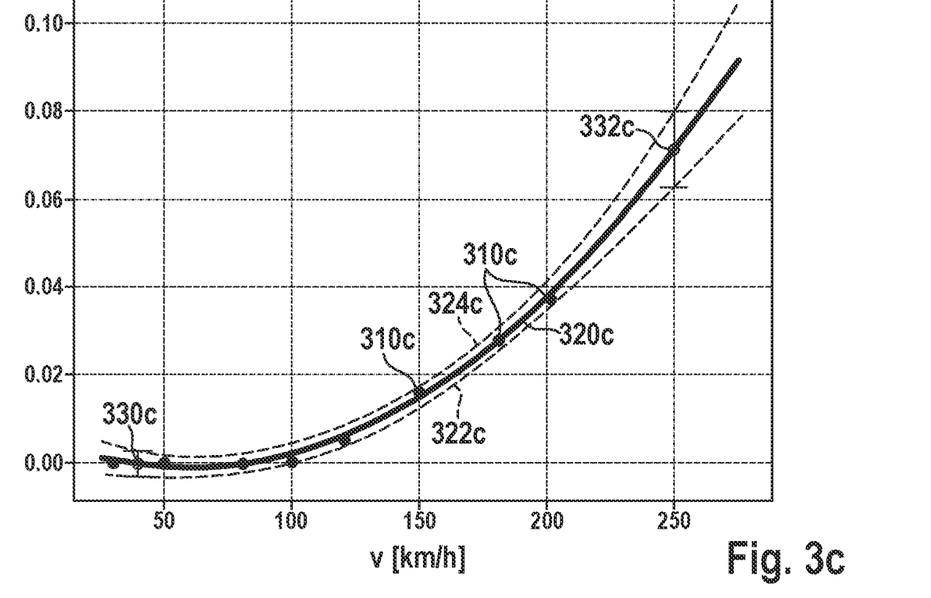
Figure 3D:
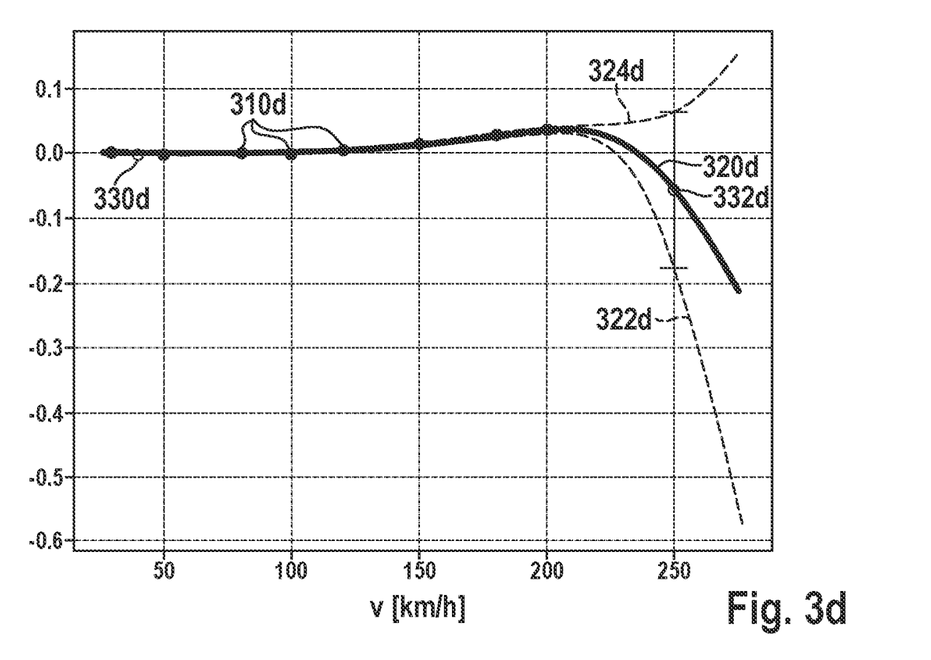

FIGS. 3b through 3c show further variants of model form errors determined at measuring points, together with metamodel 320 obtained therefrom for the model form error, as well as the respective dashed-line uncertainty curves, a lower limit 322 and an upper limit 324 for the error or the uncertainty of the metamodel being depicted. An interpolated value 330 and an extrapolated value 332 are likewise shown in each case. For example, in FIG. 3b a linear approximation curve 320b for the shown value range is formed, from which a further model form error 332b together with its associated error at a data point may then be extrapolated. Likewise, a model form error 330b may be interpolated, in this case the surrounding reference model form errors resulting in a zero line, and also the error of the metamodel for this value being 0.

FIG. 3c shows a polynomial function, as a regression curve 320c with a lower error curve 322c and an upper error curve 324c, which has been formed once again from model form errors 310c determined from measurements, and which allows the interpolation of a first further model form error 330c and the extrapolation of a second further model form error 332c, both of which are indicated by error bars. In the example from FIG. 3d, in particular after the last data point, which deviates significantly from the prior curve pattern, it is only possible to extrapolate values 332d with a high level of uncertainty, while interpolated value 330d has a very small error.

These uncertainties of the metamodel may now be evaluated in order to decide whether the model form error of the simulation model is determinable with sufficient accuracy at the particular data point. If this is the case, validation may be carried out virtually at this point by simulation. For this purpose, for example a limiting value for the uncertainty of the metamodel may be predefined. For a data point of interest, the extrapolated or interpolated error of the metamodel may then be determined and compared to this limiting value. If the error is less than the predefined limiting value, the associated data point may be classified as suitable for a virtual validation. In contrast, if the error is greater than the predefined limiting value, it may be established that at least one further reference measurement is necessary in order to make statements about this data point. The further reference measurement may be made at this data point or also at some other point.

Instead of evaluating, in the manner stated, a certain possible validation point at which a measurement has not yet taken place and determining, based on the error of the metamodel, whether this point is suitable as a virtual validation point, it is alternatively or additionally possible to form the metamodel with appropriate error intervals over a fairly large area, corresponding to error curves 322, 324 shown in FIG. 3. The dashed-line curves thus indicate interpolated or extrapolated errors of the metamodel. The necessary reference measuring points for such a metamodel may be easily distributed, for example without a specific selection, in a uniform grid or at equal intervals in the value space, or alternatively may be selected using more complex methods.

A two-sided limiting value or a limit for the error may then be selected along curve 320 that is modeled in the metamodel for the model form error. It may thus be determined that in all areas in which error 322, 324 of the metamodel is within the established limiting values and is thus small enough, virtual validations by simulation are permissible. One or multiple virtual validation points may then be selected in these areas. Alternatively, only a one-sided, for example upper, limiting value may be selected for the error range; a downward deviation then means per se that a smaller model form error is present.

In contrast, for areas in which the error of the metamodel exceeds the established limiting values, i.e., the model form error at the particular point is determinable only with a large additional error range, it may be concluded that at least one further reference measurement is to take place. It may be established that the reference measurement should be in the area in which the metamodel error exceeds the error limit; alternatively, however, one or multiple points that are situated only in the vicinity of this area may be selected for further reference measurements. This is appropriate, for example, when a reference measurement would be too costly or resource-intensive in the area of the excessively large error, but adjoining areas allow easier measurements. It may subsequently be checked whether, with the aid of this at least one additional measurement, the metamodel may be improved in such a way that the associated error is now within the limiting values. If this is the case, these areas may also be utilized for the virtual validation, as described above.

The metamodel in question together with the associated error ranges may be redetermined after every single new reference measurement that is made in the course of a validation process, in that the model form error of the new validation point is also individually determined and incorporated into the metamodel. Alternatively, it is possible to make multiple reference measurements, determine the associated model form errors for the multiple measurements, and only then adapt the metamodel, taking these model form errors into account. This is appropriate, for example, when, due to the regression curve, multiple spaced-apart areas have been recognized in which the error of the metamodel or the model form error is above the predefined limiting value, but which are suitable as virtual validation points.

In particular not only a fixed limiting value or a predefined curve, but also a relative deviation from the particular value of the model form error, may be used as a limiting value for the error of the metamodel.

Figure 4:
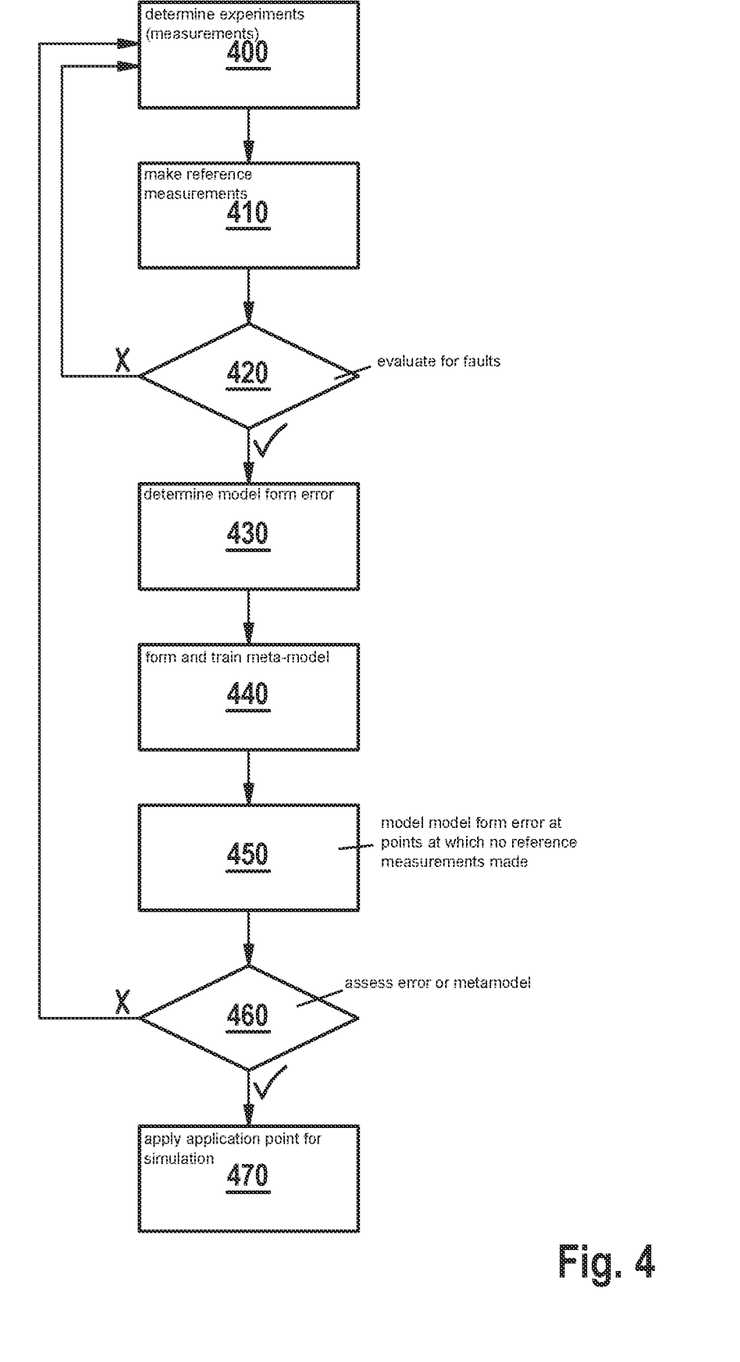
FIG. 4 shows examples of method steps according to one possible specific embodiment of the present invention.

FIG. 4 shows an example of method steps according to one possible specific example embodiment of the present invention. The experiments (measurements) for validating a predefined simulation model, which are necessary for achieving the most optimal validation of the application space possible, may initially be designed or determined in step 400. Exploitation and exploration are preferably to be maximized. For example, various methods from the area of statistical experimental design (design of experiment (DoE)) are suitable for this purpose.

The reference measurements defined in this way may then be made in step 410.

The reference measurements may optionally be evaluated in step 420, based on defaults. For example, it may be checked whether the extent of the exploration is already sufficient, for example by determining the measurement uncertainties based on the reference measurements made. If this is not the case, step 400 may be at least partially repeated and additional reference measurements selected, which are then additionally made according to step 410. These steps may be repeated until the exploration is considered to be sufficient.

The model form error may subsequently be determined in each case in step 430 for the individual reference measurements made, or at least a portion thereof. Various suitable methods and metrics may be utilized for this purpose. One option is the area validation metric already described in conjunction with FIG. 2; however, other measures that allow a quantification of the model form error may likewise be used.

These model form errors at the application points of the reference measurements may be utilized in step 440 to form and train a metamodel that maps the model form error. The model form errors of the reference measurements may thus be utilized as training data of the metamodel.

In this way, in step 450 the model form error may then also be modeled, i.e., extrapolated or interpolated, at points at which no reference measurements have been made. In particular, the model form error may now be modeled for one or multiple application points at which simulations may possibly be used instead of further reference measurements.

The error of the metamodel may then be assessed at these points in step 460. If the error is small, i.e., the model form error is determinable as accurately as possible for the checked application point, this application point may be applied in step 470 as suitable for a simulation for validating the model or for enabling functions. Simulated values for the particular application point may then be evaluated, incorporating the model form error for the validation, and no further reference measurement is absolutely necessary at this point.

In contrast, if it is established in step 460 that the error of the metamodel is too great, i.e., the model form error at this application point has a large uncertainty range, the method may once again return to step 400, so that one or multiple further necessary reference measurements may thus be appropriately planned and carried out in order to adequately validate the model via further experiments. Alternatively, it is also conceivable for these further reference measurements to already be completely planned, but for only a portion of the planned reference measurements to be carried out in step 410 (or in one of the repeated passes of steps 400 through 420), on the basis of which the model form errors are determined and the metamodel is formed.

The evaluation of the error of the metamodel in step 460 may be carried out individually for each application point in question. Alternatively, criteria may also be formed, according to which the model form errors are evaluated in combined form at multiple application points.

The error of the metamodel may also be used, for example, as an additional parameter in a cost function that determines the optimal planning and carrying out of experiments for the virtualized product release. The pareto-optimal problem in this case would thus be the minimization of the testing costs with maximum exploration, maximum exploitation, and minimum error of the metamodel that describes the model form error.

Specific embodiments of the present invention have been explained using the example of the yaw rate of a vehicle at different speeds. However, it is understood that all considerations and examples are also transferable to many other applications. In particular, such methods may be applied wherever validations or release decisions are made, at least in part, based on simulations. For example, this applies to simulations in the field of robotics or advanced driver assistance systems (ADAS) as well as to the development of control units and other systems. For example, this may involve a model of the torque in an internal combustion engine as a function of the accelerator pedal position and the rotational speed. A certain number of validation points (10, for example) may then be run through on an engine test stand; however, each measurement entails costs. The points measured on the test stand may be utilized for the validation, i.e., compared to modeled values. For each measurement, the model form error may be subsequently computed and, as described above, expanded to the entire application range as a metamodel. If areas result in which the model form error and/or the error of the metamodel are/is too large, further measuring points in these areas or near these areas may be measured on the test stand; the metamodel may subsequently be formed once again or further trained based on the expanded measurements, and the magnitude of the error in the application space may be rechecked.

An at least partial virtualized release or validation, and thus a use of specific embodiments of the present invention, is conceivable, for example, when a completely new product has not been developed, but, rather, an existing product or system is to be further developed. For the new product, a software model may then be present that is formed based on a model of the existing product with appropriate modifications.

It is understood that the described method steps may generally be carried out, at least in part, on a suitable processing unit, for example in a PC. Likewise, the steps may be carried out distributed over multiple processing units. For this purpose, a computer program containing appropriate program code may be present which carries out the required steps, for example determining the model form error or the selection of suitable reference measurements. Alternatively or additionally, steps may be additionally supplemented by user inputs; for example, it is conceivable for the limiting value of the error of the metamodel to be optionally settable, or for a user to be able to select parameters of a suitable metamodel if the supporting points that are present allow multiple possible approximations. In addition, depending on the implementation, the reference measurements via which the reference measured values that are necessary for the method are obtained may either be automatically carried out and controlled by the system, for example if appropriate interfaces for measurements and control commands are present, or the parameters for required reference measurements could be stated and the measurement itself could then take place using some other system, it then being optionally possible for the required data to be transmitted between these two systems in a suitable manner.

What is claimed is:

1. A method for assessing validation points for a simulation model, comprising the following steps:
   obtaining a reference measured value for each of at least two measuring points, each of which is defined by one or multiple parameters;
   determining, in each case, a model form error for each measuring point of the at least two measuring points, based on a deviation between the reference measured value of the measuring point and a probability distribution for a simulation value at the measuring point, the probability distribution for the simulation value being obtained from the simulation model;
   forming a metamodel of the model form errors, based on the determined model form errors for the at least two measuring points;
   determining an uncertainty of the metamodel for at least one further data point that is not contained in the at least two measuring points; and
   defining the at least one data point as sufficient for a virtual validation when the uncertainty of the metamodel at the at least one further data point is less than a predefined limiting value.

2. The method as recited in claim 1, wherein the probability distribution is a probability box that is formed from epistemic and/or aleatoric input uncertainties of the simulation model.

3. The method as recited in claim 1, wherein each reference measured value is indicated as a distribution function, based on the measurement uncertainty at the measuring point.

4. The method as recited in claim 1, wherein the model form error is determined as an area validation metric that indicates the deviation between the reference measured value and the probability distribution for the simulation value.

5. The method as recited in claim 1, further including, when the uncertainty of the metamodel is greater than a predefined limiting value at at least one data point:
   obtaining at least one further reference measured value at at least one further measuring point;
   determining the model form error for the further measuring point; and
   using the model form error for the further measuring point in order to improve the metamodel.

6. The method as recited in claim 5, wherein the at least one further measuring point corresponds to the at least one data point at which the uncertainty is greater than the predefined limiting value.

7. The method as recited in claim 1, further comprising:
   selecting suitable measuring points for obtaining reference values from a plurality of data points, based on a cost function that takes into account at least the testing costs for obtaining a reference value at a measuring point, and as an exploration and exploitation that are obtained via a reference value at the measuring point.

8. The method as recited in claim 7, further comprising:
   forming an expanded cost function that additionally includes the uncertainty of the metamodel for the plurality of data points.

9. The method as recited in claim 7, further comprising:
   requesting one or multiple reference measured values at the selected measuring points.

10. The method as recited in claim 1, further comprising:
    checking whether the measurement uncertainty of the obtained reference measured values is below a predefined limiting value; and
    when the measurement uncertainty is not below the predefined limiting value, obtaining further reference measured values before forming the metamodel.

11. A processing unit including a computer configured to assess validation points for a simulation model, the processing unit configured to: obtain a reference measured value for each of at least two measuring points, each of which is defined by one or multiple parameters; determine, in each case, a model form error for each measuring point of the at least two measuring points, based on a deviation between the reference measured value of the measuring point and a probability distribution for a simulation value at the measuring point, the probability distribution for the simulation value being obtained from the simulation model; form a metamodel of the model form errors, based on the determined model form errors for the at least two measuring points; determine an uncertainty of the metamodel for at least one further data point that is not contained in the at least two measuring points; and define the at least one data point as sufficient for a virtual validation when the uncertainty of the metamodel at the at least one further data point is less than a predefined limiting value.

12. A non-transitory machine-readable memory medium on which is stored a computer program for assessing validation points for a simulation model, the computer program, when executed by a computer, causing the computer to perform the following steps:

obtaining a reference measured value for each of at least two measuring points, each of which is defined by one or multiple parameters;

determining, in each case, a model form error for each measuring point of the at least two measuring points, based on a deviation between the reference measured value of the measuring point and a probability distribution for a simulation value at the measuring point, the probability distribution for the simulation value being obtained from the simulation model;

forming a metamodel of the model form errors, based on the determined model form errors for the at least two measuring points;

determining an uncertainty of the metamodel for at least one further data point that is not contained in the at least two measuring points; and defining the at least one data point as sufficient for a virtual validation when the uncertainty of the metamodel at the at least one further data point is less than a predefined limiting value.

* * * * *